(12) United States Patent
Maki et al.

(10) Patent No.: US 10,199,797 B2
(45) Date of Patent: Feb. 5, 2019

(54) LIGHT-EMITTING ELEMENT MODULE, ATOMIC OSCILLATOR, AND ELECTRONIC APPARATUS

(71) Applicant: Seiko Epson Corporation, Tokyo (JP)

(72) Inventors: Yoshiyuki Maki, Suwa (JP); Tsunenori Shibata, Minowa (JP); Koji Chindo, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/695,321

(22) Filed: Sep. 5, 2017

(65) Prior Publication Data

US 2018/0069372 A1    Mar. 8, 2018

(30) Foreign Application Priority Data

Sep. 7, 2016 (JP) .................. 2016-174978

(51) Int. Cl.
| | |
|---|---|
| H01S 5/022 | (2006.01) |
| H01S 5/024 | (2006.01) |
| H01S 5/183 | (2006.01) |
| H03L 7/26 | (2006.01) |

(52) U.S. Cl.
CPC ...... H01S 5/02415 (2013.01); H01S 5/02476 (2013.01); H03L 7/26 (2013.01); *H01S 5/02208* (2013.01); *H01S 5/183* (2013.01)

(58) Field of Classification Search
CPC ............ H01S 5/02469; H01S 5/02415; H01S 5/02208–5/02216; H01S 5/024–5/02492
See application file for complete search history.

(56) References Cited

U.S. PATENT DOCUMENTS

| | | | | |
|---|---|---|---|---|
| 5,233,622 A | * | 8/1993 | Iwamoto ............ | H01S 5/02415 372/34 |
| 2007/0014321 A1 | * | 1/2007 | Shimotsu ............ | H01S 5/02212 372/36 |
| 2007/0237196 A1 | * | 10/2007 | Oomori ............... | H01S 5/02236 372/36 |
| 2009/0315629 A1 | * | 12/2009 | Chindo .................. | G04F 5/145 331/94.1 |
| 2014/0328361 A1 | * | 11/2014 | Matsusue ............ | H01S 5/02212 372/36 |
| 2014/0375970 A1 | * | 12/2014 | Nagahara ............... | G03B 21/16 353/119 |
| 2015/0109680 A1 | * | 4/2015 | Vorndran ............ | H01S 5/02288 359/641 |
| 2017/0063032 A1 | * | 3/2017 | Morizumi ........... | H01S 5/02208 |

FOREIGN PATENT DOCUMENTS

JP          07-104332 A      4/1995

* cited by examiner

*Primary Examiner* — Xinning(Tom) Niu
*Assistant Examiner* — Sean P Hagan
(74) *Attorney, Agent, or Firm* — Harness, Dickey & Pierce, P.L.C.

(57) ABSTRACT

A light-emitting element module includes: a Peltier device; a light-emitting element that is disposed on the Peltier device; and a package that accommodates the Peltier device and the light-emitting element, the package including a base on which the Peltier device is disposed and a lid joined to the base. When Ts is external temperature of the package, Tv is temperature of the light-emitting element, Tc1 is temperature of the base, and Tc2 is temperature of the lid, Ts<Tc2<Tc1 is satisfied in a case of Tv<Ts.

8 Claims, 9 Drawing Sheets

LIGHT-EMITTING ELEMENT MODULE, ATOMIC OSCILLATOR, AND ELECTRONIC APPARATUS

This application claims priority to Japanese Patent Application No. 2016-174978, filed Sep. 7, 2016, the entirety of which is hereby incorporated by reference.

BACKGROUND

1. Technical Field

The present invention relates to a light-emitting element module, an atomic oscillator, and an electronic apparatus.

2. Related Art

There are known light-emitting element modules that adjust temperatures of the light-emitting elements using Peltier devices (for example, see JP-A-7-104332). A laser light-emitting device which is disclosed in JP-A-7-104332 and is an example of the light-emitting element module includes a semiconductor laser element (light-emitting element) and an electronic thermo-element (Peltier device) using the Peltier effect and a package accommodating them. Here, the semiconductor laser element is mounted on the inner surface of the package via the electronic thermo-element. Then, temperature of the semiconductor laser element is adjusted by the electronic thermo-element. Light from the semiconductor laser element is output outside via a window installed in the package.

In the laser light-emitting device disclosed in JP-A-7-104332, when ambient temperature becomes high, the temperature of the entire package is considerably increased. Thus, the temperature of the semiconductor laser element is varied due to radiation of heat from the package. Accordingly, there is a problem that the wavelength of light from the semiconductor laser element may vary.

Here, when the external temperature of the package is higher than a target temperature of the semiconductor laser element, the temperature of a wall surface side of the package of the electronic thermo-element becomes high, and thus the package is heated. In the related art, since a heat dissipation property of the package is bad, the temperature of the package is considerably high with respect to the temperature of the semiconductor laser element. As a result, the above-described problem arises.

SUMMARY

An advantage of some aspects of the invention is to provide a light-emitting element module capable of reducing a variation in the temperature of a light-emitting element using a Peltier device even under high temperature and provides an atomic oscillator, an electronic apparatus, and a vehicle that include the light-emitting element module and have excellent reliability.

The invention can be implemented as the following forms or application examples.

A light-emitting element module according to an application example of the invention includes: a Peltier device; a light-emitting element that is disposed on the Peltier device; and a package that includes a base in which the Peltier device is disposed and a lid which is joined to the base, in which an internal space accommodating the Peltier device and the light-emitting element is formed between the base and the lid. When $T_s$ is external temperature of the package, $T_v$ is temperature of the light-emitting element, $T_{c1}$ is temperature of the base, and $T_{c2}$ is temperature of the lid, a relation of $T_s < T_{c2} < T_{c1}$ is satisfied under the condition that a relation of $T_v < T_s$.

In the light-emitting element module, the relation of $T_{c2} < T_{c1}$ is satisfied even under the condition that the relation of $T_v < T_s$ is satisfied. Therefore, it is possible to reduce a temperature difference between the light-emitting element and the lid. Accordingly, it is possible to reduce radiation (emission) of heat from the lid to the light-emitting element even when an installation environment of the light-emitting element module is at high temperature. Thus, it is possible to reduce a variation in the temperature of the light-emitting element using the Peltier device even under high temperature.

In the light-emitting element module according to the application example, it is preferable that the lid includes a protrusion portion protruding to an opposite side to the base.

With this configuration, it is possible to increase the area of the opposite surface to the base of the lid, and thus improve a heat dissipation property of the lid. Therefore, it is possible to satisfy the relation of $T_{c2} < T_{c1}$ with a relatively simple configuration and it is possible to enlarge a difference between the temperature ($T_{c1}$) of the base and the temperature ($T_{c2}$) of the lid.

In the light-emitting element module according to the application example, it is preferable that the lid includes a window which is disposed in the protrusion portion and through which light from the light-emitting element is transmitted.

With this configuration, it is possible to increase a separate distance between the window portion and the light-emitting element. Therefore, it is possible to reduce the radiation of the heat from the window portion to the light-emitting element. The window can be formed by effectively using the protrusion portion. Therefore, it is possible to further miniaturize the light-emitting element module than when the distance between the entire lid and the light-emitting element is increased.

In the light-emitting element module according to the application example, it is preferable that the lid includes a first portion which supports the protrusion portion, a second portion which is joined to the base, and a third portion which is located between the first and second portions and has a thickness thinner than the first portion.

With this configuration, by setting a thickness of the third portion to be thin, it is possible to improve thermal resistance of the third portion. Therefore, it is possible to reduce transmission of heat from the second portion which is a joining portion to the base of the lid to the first portion. A thickness of the first portion can be set to be thick and it is possible to ensure necessary mechanical strength of the lid. Further, it is possible to reduce stress occurring in the first portion when the lid and the base are joined and it is possible to reduce breakdown of the joining portions of the window and the protrusion portion.

In the light-emitting element module according to the application example, it is preferable that a thickness of the second portion is thinner than a thickness of the first portion.

With this configuration, it can be easy to join the lid to the base by seam welding or the like.

In the light-emitting element module according to the application example, it is preferable that the pressure of the internal space of is depressurized more than an atmospheric pressure.

With this configuration, it is possible to effectively reduce a variation in the temperature of the light-emitting element due to a change in the external temperature of the package.

When the internal space is depressurized, an influence of heat radiation from the lid to the light-emitting element is considerable. Therefore, in this case, it is particularly useful to satisfy the relation of Ts<Tc2<Tc1 under the condition that the relation of Tv<Ts is satisfied.

In the light-emitting element module according to the application example, it is preferable that thermal conductivity of a material of the lid is higher than thermal conductivity of a material of the base.

With this configuration, it is possible to improve the heat dissipation property of the lid and it is possible to improve thermal resistance of the base. Therefore, it is possible to satisfy the relation of Tc2<Tc1 with a relatively simple configuration and it is possible to increase the difference between the temperature (Tc1) of the base and the temperature (Tc2) of the lid.

An atomic oscillator according to an application example of the invention includes the light-emitting element module according to the application example. In the atomic oscillator, it is possible to reduce a variation in the temperature of the light-emitting element using the Peltier device even under high temperature. Therefore, by reducing a variation in the wavelength of the light from the light-emitting element, it is possible to realize the atomic oscillator with an excellent oscillation property using the light.

It is preferable that the atomic oscillator according to the application example includes a heat dissipation member that is disposed to be in contact with at least a part of an outer surface of the lid and has a heat dissipation property.

With this configuration, it is possible to considerably dissipate heat from the lid. Therefore, it is possible to satisfy the relation of Tc2<Tc1 with a relatively simple configuration and it is possible to increase the difference between the temperature (Tc1) of the base and the temperature (Tc2) of the lid.

An electronic apparatus according to an application example of the invention includes the light-emitting element module according to the application example.

In the electronic apparatus, it is possible to reduce a variation in the temperature of the light-emitting element using the Peltier device even under high temperature.

A vehicle according to an application example of the invention includes the light-emitting element module according to the application example.

In the vehicle, it is possible to reduce a variation in the temperature of the light-emitting element using the Peltier device even under high temperature.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a light-emitting element module, an atomic oscillator, an electronic apparatus, and a vehicle will be described with reference to the appended drawings according to embodiments of the invention.

1. Atomic Oscillator

First, an atomic oscillator (an atomic oscillator including a light-emitting element module) according to an embodiment will be described.

Figure 1:
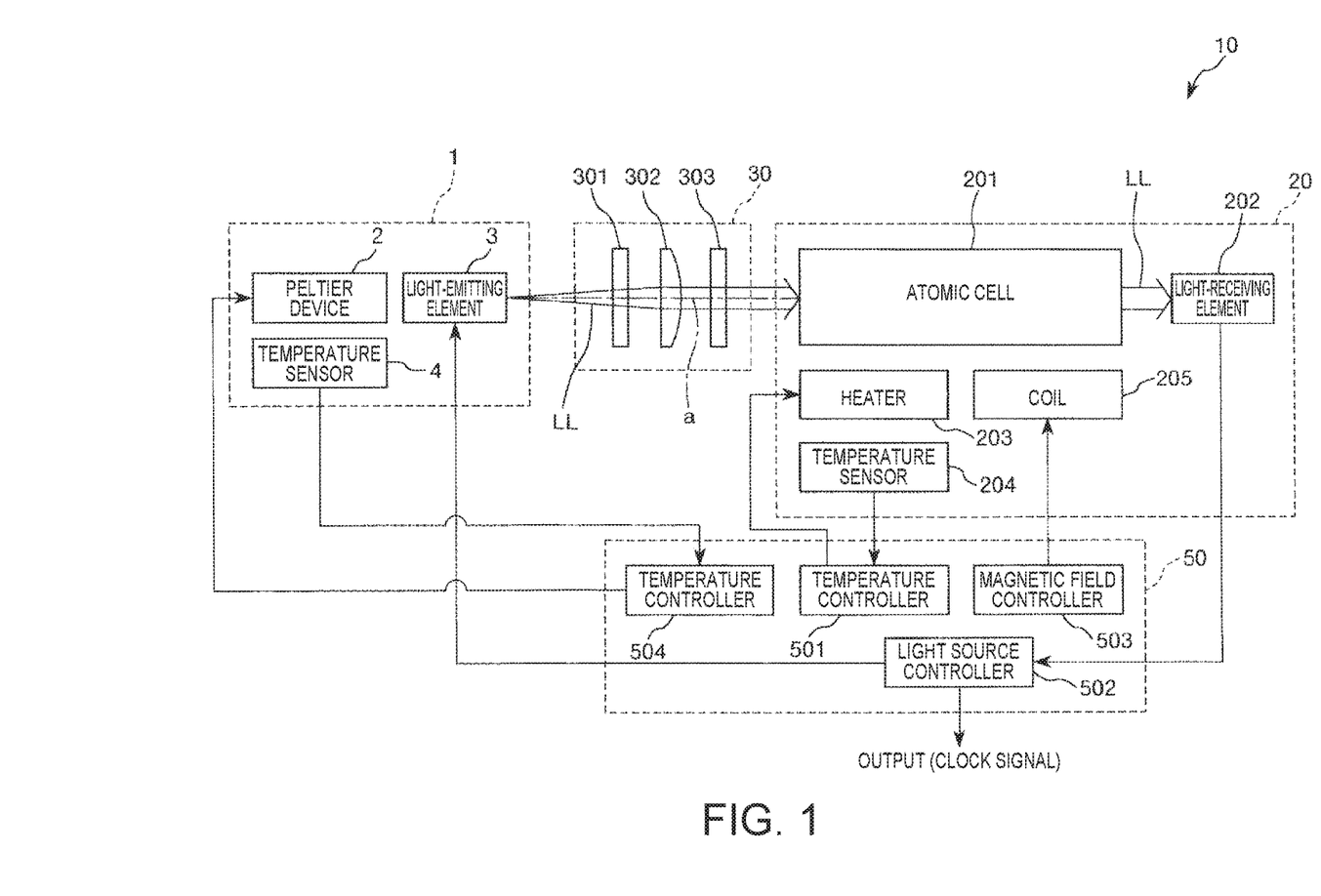
FIG. 1 is a schematic diagram illustrating an atomic oscillator according to an embodiment.

FIG. 1 is a schematic diagram illustrating an atomic oscillator according to the embodiment.

An atomic oscillator 10 illustrated in FIG. 1 is an atomic oscillator that uses coherent population trapping (CPT) in which a phenomenon occurs in which two pieces of resonance light are transmitted without being absorbed by alkali metal atoms when the two pieces of resonance light with specific different wavelengths are simultaneously radiated to the alkali metal atoms. The phenomenon of the coherent population trapping is also called an electromagnetically induced transparency (EIT) phenomenon.

As illustrated in FIG. 1, the atomic oscillator 10 includes a light-emitting element module 1, an atomic cell unit 20, an optical system unit 30 installed between the light-emitting element module 1 and the atomic cell unit 20, and a controller 50 that controls operations of the light-emitting element module 1 and the atomic cell unit 20. Hereinafter, an overview of the atomic oscillator 10 will be described first.

The light-emitting element module 1 includes a Peltier device 2, a light-emitting element 3, and a temperature sensor 4. The light-emitting element 3 emits linearly polarized light LL containing two types of light with different frequencies. The temperature sensor 4 measures temperature of the light-emitting element 3. The Peltier device 2 adjusts the temperature of the light-emitting element 3 (heats or cools the light-emitting element 3).

The optical system unit 30 includes a light reduction filter 301, a lens 302, and a quarter wavelength plate 303. The light reduction filter 301 reduces the intensity of the light LL from the above-described light-emitting element 3. The lens 302 adjusts the angle of radiation of the light LL (for example, adjusts the light LL to parallel light). The quarter wavelength plate 303 converts two types of light with different frequencies contained in the light LL from linearly polarized light to circularly polarized light (right-handed circularly polarized light or left-handed circularly polarized light).

The atomic cell unit 20 includes an atomic cell 201, a light-receiving element 202, a heater 203, a temperature sensor 204, and a coil 205.

The atomic cell 201 has light transmittance and alkali metal is sealed inside the atomic cell 201. An alkali metal atom has energy levels of three level systems formed by two different ground levels and an excited level. The light LL from the light-emitting element 3 is incident on the atomic cell 201 via the light reduction filter 301, the lens 302, and the quarter wavelength plate 303. Then, the light-receiving element 202 receives and detects the light LL passing through the atomic cell 201.

The heater 203 heats the alkali metal inside the atomic cell 201 to change at least a part of the alkali metal into a gas state. The temperature sensor 204 measures temperature of the atomic cell 201. The coil 205 applies a magnetic field in a predetermined direction to the alkali metal inside the atomic cell 201 to perform Zeeman splitting on the energy levels of the alkali metal atoms. When the pair of pieces of circularly polarized resonance light described above are radiated to the alkali metal atoms in a state in which the alkali metal atoms are subjected to the Zeeman splitting in this way, the number of alkali metal atoms in a specific energy level among the plurality of levels at which the alkali metal atoms are subjected to the splitting can be relatively greater than the number of alkali metal atoms at another energy level. Therefore, it is possible to increase the number of atoms realizing a specific EIT phenomenon, raise a specific EIT signal, and consequently improve an oscillation property of the atomic oscillator 10.

The controller 50 includes a temperature controller 501, a light source controller 502, a magnetic field controller 503, and a temperature controller 504. Based on a measurement result of the temperature sensor 204, the temperature controller 501 controls electrification to the heater 203 such that a preferred temperature is maintained inside the atomic cell 201. The magnetic field controller 503 controls electrification to the coil 205 such that the magnetic field generated by the coil 205 is constant. Based on a measurement result of the temperature sensor 4, the temperature controller 504 controls electrification to the Peltier device 2 such that the temperature of the light-emitting element 3 is maintained at a preferred temperature (within a temperature region).

Based on a detection result of the light-receiving element 202, the light source controller 502 controls the frequencies of two types of light contained in the light LL from the light-emitting element 3 such that an EIT phenomenon occurs. Here, the EIT phenomenon occurs when the two types of light become the pair of pieces of resonance light with a frequency difference equivalent to an energy difference between two ground levels of the alkali metal atoms inside the atomic cell 201. The light source controller 502 includes a voltage controlled crystal oscillator (not illustrated) of which an oscillation frequency is controlled for stabilization in synchronization with control of the frequencies of the two types of light described above and outputs an output signal of the voltage controlled crystal oscillator (VCXO) as an output signal (clock signal) of the atomic oscillator 10.

An overview of the atomic oscillator 10 has been described. Hereinafter, a more specific configuration of the atomic oscillator 10 will be described with reference to FIGS. 2 and 3.

Figure 2:
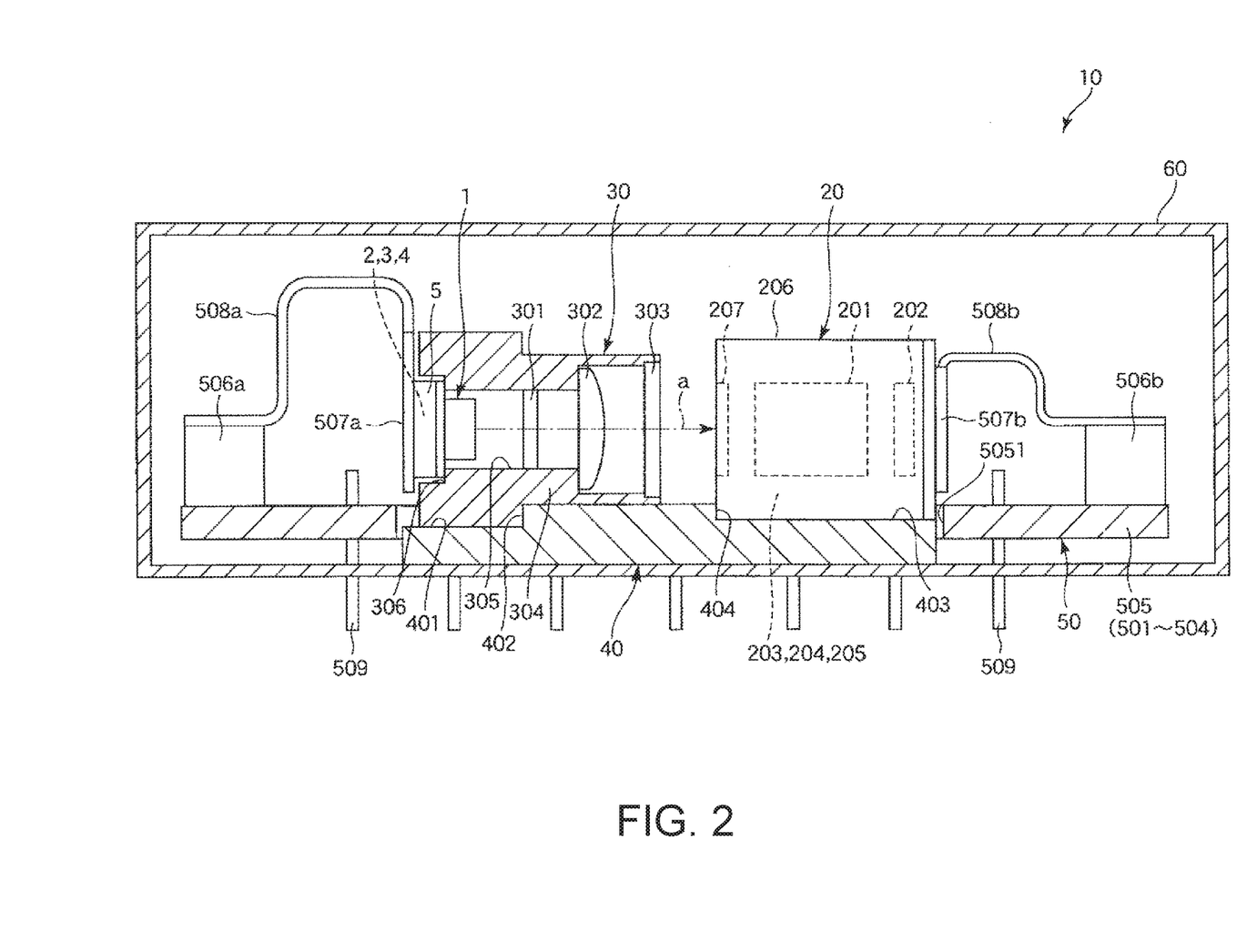
FIG. 2 is a sectional side view illustrating the atomic oscillator illustrated in FIG. 1.
Figure 3:
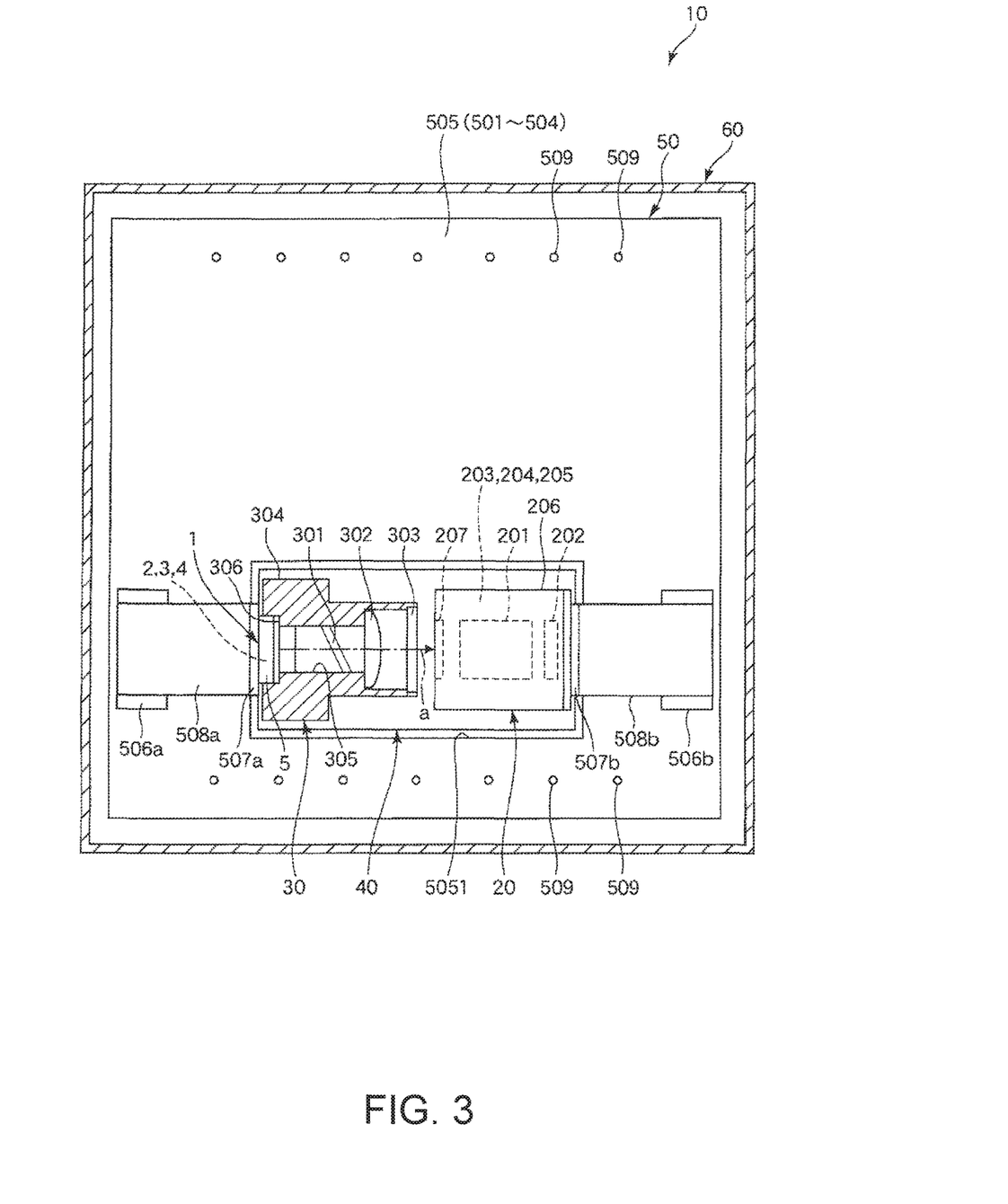
FIG. 3 is a plan view illustrating the atomic oscillator illustrated in FIG. 2.

FIG. 2 is a sectional side view illustrating the atomic oscillator illustrated in FIG. 1. FIG. 3 is a plan view illustrating the atomic oscillator illustrated in FIG. 2. Hereinafter, the upper side in FIG. 2 is referred to as a "top" and the lower side is referred to as a "bottom" to facilitate the description.

As illustrated in FIG. 2, the atomic oscillator 10 includes a light-emitting element module 1, an atomic cell unit 20, an optical system unit 30 that holds the light-emitting element module 1, a hold member 40 that collectively holds the atomic cell unit 20 and the optical system unit 30, a controller 50 that is electrically connected to the light-emitting element module 1 and the atomic cell unit 20, and a package 60 that accommodates them.

The light-emitting element module 1 includes the Peltier device 2, the light-emitting element 3, the temperature sensor 4, and a package 5 accommodating them. The light-emitting element module 1 will be described below in detail.

The optical system unit 30 includes a light reduction filter 301, a lens 302, a quarter wavelength plate 303, and a holder 304 that holds them. Here, the holder 304 includes through-holes 305 of which both ends are open. The through-hole 305 is a passage region of the light LL. The light reduction filter 301, the lens 302, and the quarter wavelength plate 303 are disposed in this order inside the through-hole 305. As illustrated in FIG. 3, the light reduction filter 301 is fixed to the holder 304 by an adhesive or the like (not illustrated) to be inclined with respect to a surface that has the optical axis a as a normal line. The lens 302 and the quarter wavelength plate 303 are fixed to the holder 304 by an adhesive or the like (not illustrated) along a surface that has the optical axis a as a normal line. The light-emitting element module 1 is mounted on an end of the through-hole 305 close to the light reduction filter 301 (the left of FIG. 2) by a mounting member (not illustrated). The holder 304 is formed of, for example, a metal material such as aluminum and has a heat dissipation property. In this way, it is possible to efficiently dissipate the heat from the light-emitting element module 1.

The optical system unit 30 may not include at least one of the light reduction filter 301 and the lens 302 depending on the intensity of the light LL from the light-emitting element 3, a radiation angle, or the like. The optical system unit 30 may include an optical element other than the light reduction filter 301, the lens 302, and the quarter wavelength plate 303. The disposition order of the light reduction filter 301, the lens 302, and the quarter wavelength plate 303 is not limited to the illustrated order and the light reduction filter 301, the lens 302, and the quarter wavelength plate 303 may be disposed in any order.

The atomic cell unit 20 includes the atomic cell 201, a light-receiving element 202, a heater 203, a temperature sensor 204, a coil 205, and a package 206 that accommodates them.

An alkali metal such as rubidium, cesium, or sodium in a gaseous form is sealed inside the atomic cell 201. In the atomic cell 201, a noble gas such as argon or neon or an inert gas such as nitrogen may be sealed as a buffer gas along with the alkali metal gas, as necessary.

Although not illustrated, the atomic cell 201 includes, for example, a trunk portion that has a through-hole with a pillar and one pair of windows that form an internal space sealed airtight by sealing both openings of the through-hole of the trunk portion. Here, the light LL incident on the atomic cell 201 is transmitted through one window between the pair of windows and the light LL emitted from the inside of the atomic cell 201 is transmitted through the other window. Accordingly, a material used to form each window may have transmittance with respect to the light LL and is not particularly limited. For example, a glass material or a quartz crystal can be exemplified. On the other hand, a material used to form the trunk portion is not particularly limited and a metal material, a resin material, a glass material, a silicon material, and a quartz crystal can be exemplified. From the viewpoint of workability or joining with each window, it is desirable to use a glass material or a silicon material. A method of joining the trunk portion with each window can be determined according to the material and is not particularly limited. For example, a direct joining method or an anode joining method can be used.

The light-receiving element 202 is disposed to be opposite to the light-emitting element module 1 with respect to the atomic cell 201. The light-receiving element 202 is not particularly limited as long as the light-receiving element can detect the intensity of the light LL (the pair of pieces of resonance light) transmitted through the atomic cell 201. For example, a solar cell or a light detector (light-receiving element) such as a photodiode is exemplified.

Although not illustrated, for example, the heater 203 is disposed on the above-described atomic cell 201 or is connected to the atomic cell 201 via a thermal conductive member such as a metal. The heater 203 is not particularly limited as long as the atomic cell 201 (more specifically, the alkali metal inside the atomic cell 201) can be heated. For example, a Peltier device or any of various heaters having a heating resistor can be exemplified.

Although not illustrated, for example, the temperature sensor 204 is disposed near the atomic cell 201 or the heater 203. The temperature sensor 204 is not particularly limited as long as the temperature of the atomic cell 201 or the heater 203 can be measured. For example, various known temperature sensors such as a thermistor or a thermocouple can be exemplified.

Although not illustrated, for example, the coil 205 is a solenoid type coil disposed to be wound around the outer circumference of the atomic cell 201 or a pair of Helmholtz coils facing each other with the atomic cell 201 interposed therebetween. The coil 205 generates a magnetic field in a direction (a parallel direction) along the optical axis a of the light LL inside the atomic cell 201. In this way, a gap between different energy levels at which the alkali metal atoms inside the atomic cell 201 are degenerated can be spread by Zeeman splitting to improve a resolution and the line width of the EIT signal can be reduced. The magnetic field generated by the coil 205 may be one magnetic field between a direct-current magnetic field and an alternating-current magnetic field or may be a magnetic field in which a direct-current magnetic field and an alternating-current magnetic field are superimposed.

Although not illustrated, the package 206 includes, for example, a plate-shaped substrate and a cover joined to the substrate. An airtight space in which the atomic cell 201, the light-receiving element 202, the heater 203, the temperature sensor 204, and the coil 205 described above are accommodated is formed between the substrate and the cover. Here, the substrate directly or indirectly holds the atomic cell 201, the light-receiving element 202, the heater 203, the temperature sensor 204, and the coil 205. A plurality of terminals electrically connected to the light-receiving element 202, the heater 203, the temperature sensor 204, and the coil 205 are installed on the outer surface of the substrate. On the other hand, the cover forms a bottom cylinder of which one end is open and the opening is blocked by the substrate. A window 207 that has transmission properties for the light LL is installed at the other end (bottom portion) of the cover.

A material of portions other than the window of the cover and the substrate of the package 206 is not particularly limited. For example, a ceramics or a metal can be exemplified. As a material of the window 207, for example, a glass material can be exemplified. A method of joining the substrate to the cover is not particularly limited. For example, soldering, seam welding, or energy line welding (laser welding, electron beam welding, or the like) can be exemplified. The package 206 is internally depressurized than the atmospheric pressure. In this way, it is possible to control the temperature of the atomic cell 201 simply and with high precision. As a result, it is possible to improve the property of the atomic oscillator 10.

The hold member 40 is formed in a plate shape. The atomic cell unit 20 and the optical system unit 30 described above are placed on one surface of the hold member 40. The hold member 40 has an installation surface 401 formed along the shape of the lower surface of the holder 304 of the optical system unit 30. A stepped portion 402 is formed on the installation surface 401. The stepped portion 402 engages with the stepped portion of the lower surface of the holder 304 and regulates movement of the holder 304 toward the side of the atomic cell unit 20 (the right side of FIG. 2). Similarly, the hold member 40 has an installation surface 403 formed along the shape of the lower surface of the package 206 of the atomic cell unit 20. A stepped portion 404 is formed on the installation surface 403. The stepped portion 404 engages with the boundary of the package 206 (the boundary on the left side of FIG. 2) and regulates movement of the package 206 toward the side of the optical system unit 30 (the left side of FIG. 2).

In this way, the hold member 40 can regulate a relative positional relation between the atomic cell unit 20 and the optical system unit 30. Then, since the light-emitting element module 1 is fixed to the holder 304, a relative positional relation of the light-emitting element module 1 relative to the atomic cell unit 20 and the optical system unit 30 is also regulated. Here, the package 206 and the holder 304 are fixed to the hold member 40 by a fixing member such as a screw (not illustrated). The hold member 40 is fixed to the package 60 by a fixing member such as a screw (not illustrated). The hold member 40 is formed of, for example, a metal material such as aluminum and has a heat dissipation property. In this way, it is possible to efficiently dissipate the heat from the light-emitting element module 1.

As illustrated in FIG. 3, the controller 50 includes a circuit substrate 505, two connectors 506a and 506b installed on the circuit substrate 505, a rigid wiring substrate 507a connected to the light-emitting element module 1, a rigid wiring substrate 507b connected to the atomic cell unit 20, a flexible wiring substrate 508a connecting the connector 506a to the rigid wiring substrate 507a, a flexible wiring substrate 508b connecting the connector 506b to the rigid wiring substrate 507b, and a plurality of lead pins 509 penetrating the circuit substrate 505.

Here, an integrated circuit (IC) chip (not illustrated) is installed in the circuit substrate 505. The IC chip functions as the temperature controller 501, the light source controller 502, the magnetic field controller 503, and the temperature controller 504 described above. The circuit substrate 505 includes a through-hole 5051 into which the above-described hold member 40 is inserted. The circuit substrate 505 is held by the package 60 via the plurality of lead pins 509. The plurality of lead pins 509 penetrate the outside and the inside of the package 60 and are electrically connected to the circuit substrate 505.

The configuration in which the circuit substrate 505 is electrically connected to the light-emitting element module 1 and the configuration in which the circuit substrate 505 is electrically connected to the atomic cell unit 20 are not limited to the connectors 506a and 506b, the rigid wiring substrates 507a and 507b, and the flexible wiring substrates 508a and 508b illustrated in the drawing, but other known connectors and interconnections may be used.

The package 60 is formed of, for example, a metal material such as Kovar and has a magnetic shielding property. In this way, it is possible to reduce an adverse influence of an external magnetic field on the property of the atomic oscillator 10. The package 60 may be internally depressurized or may be at the atmospheric pressure.

Detailed Description of Light-Emitting Element Module

Figure 4:
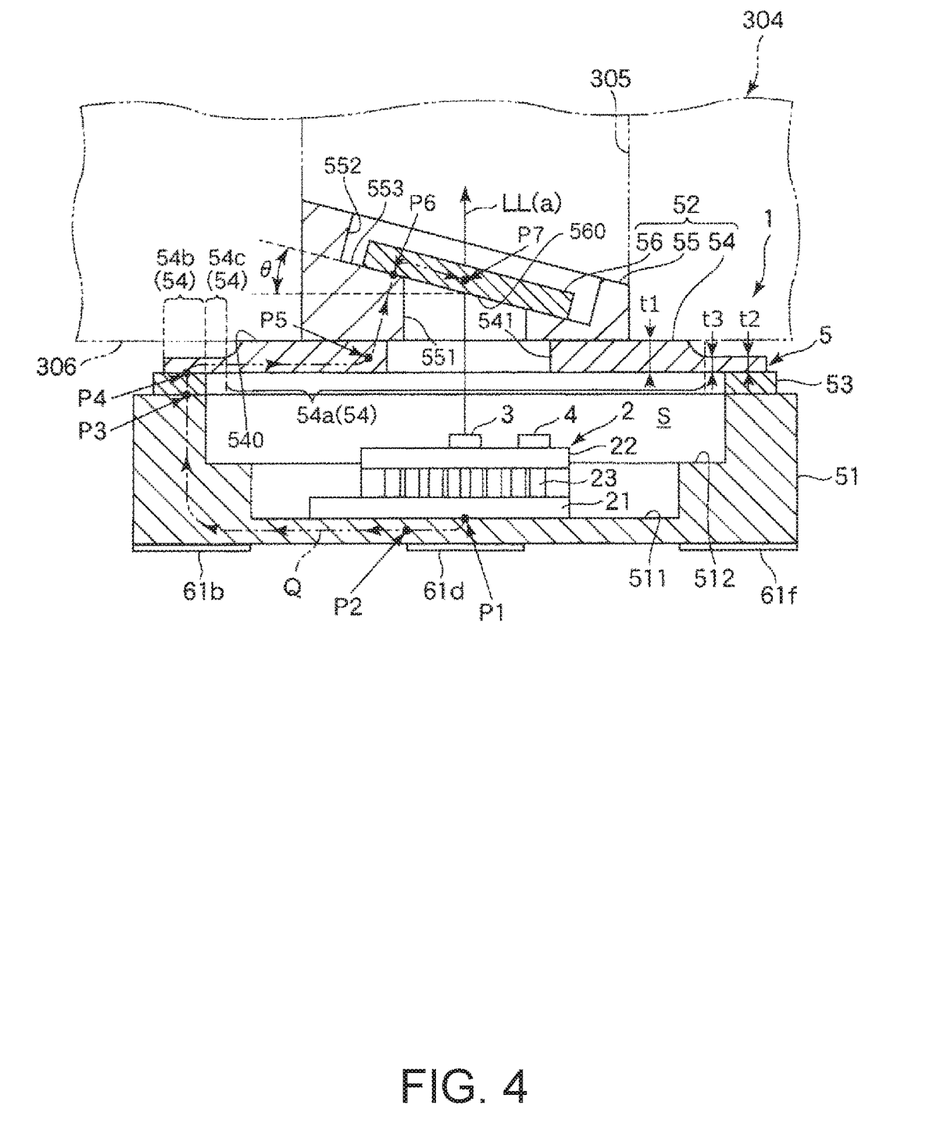
FIG. 4 is a sectional view illustrating a light-emitting element module included in the atomic oscillator illustrated in FIGS. 2 and 3.
Figure 5:
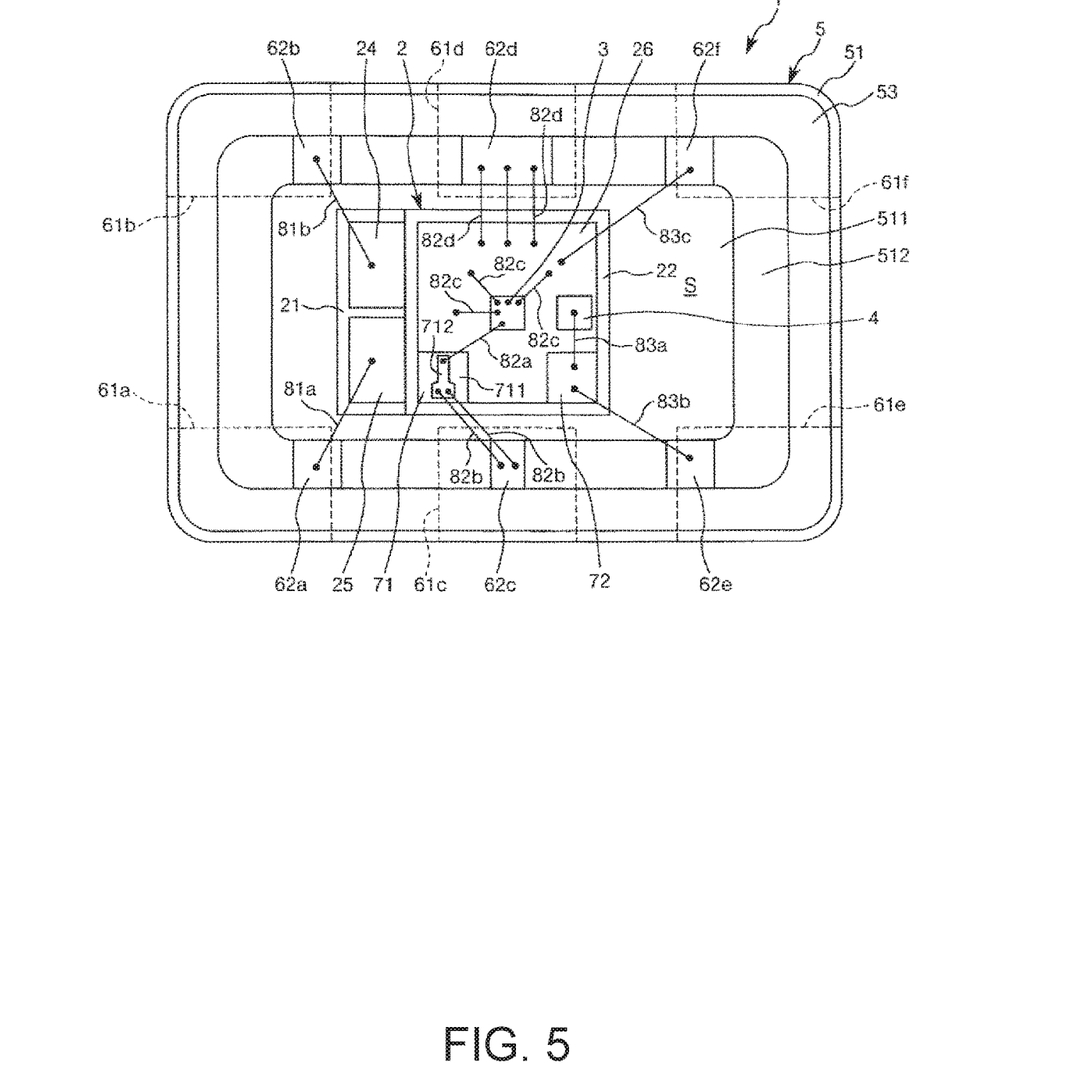
FIG. 5 is a plan view illustrating the light-emitting element module illustrated in FIG. 4.
Figure 6:
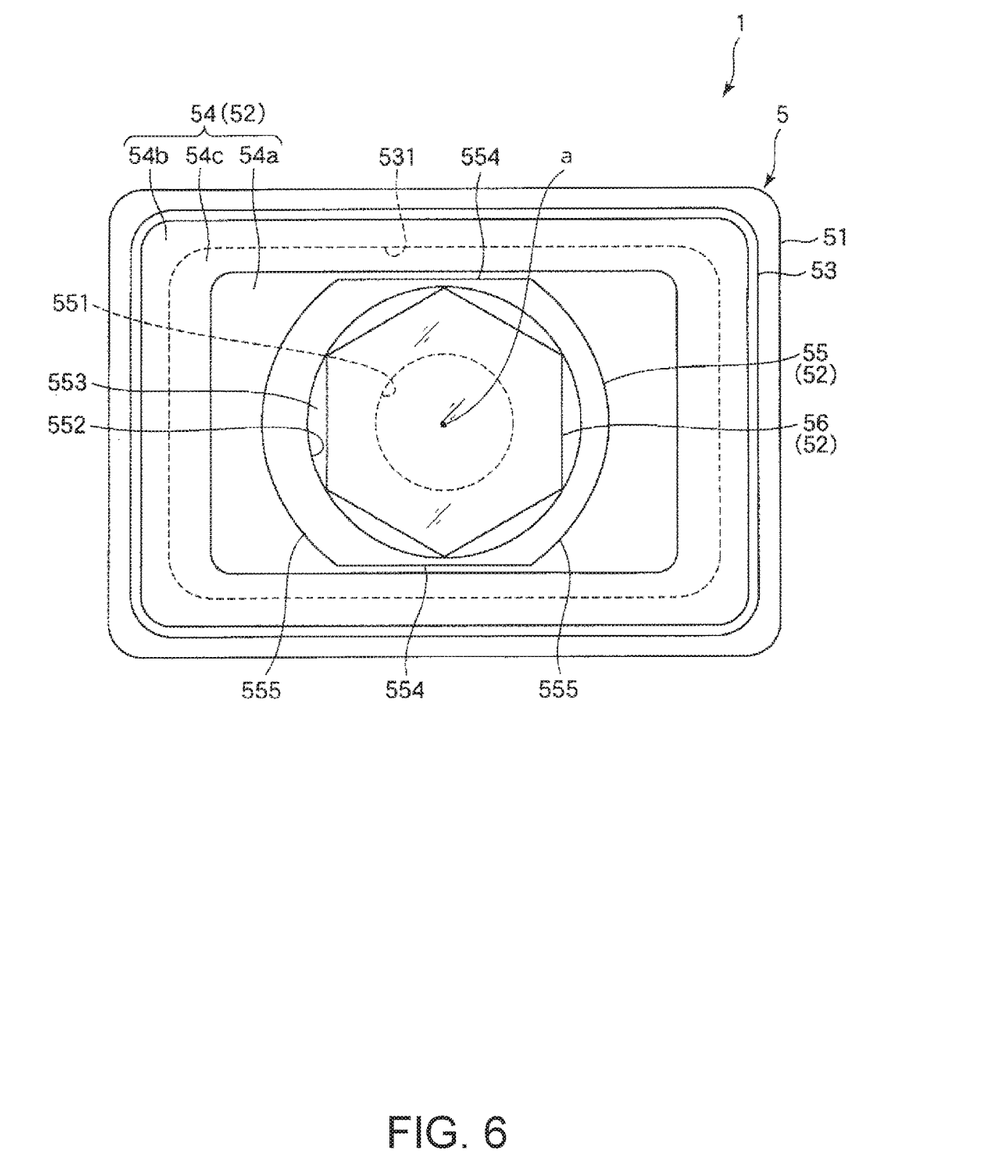
FIG. 6 is a plan view illustrating a lid included in the light-emitting element module illustrated in FIG. 4.
Figure 7:
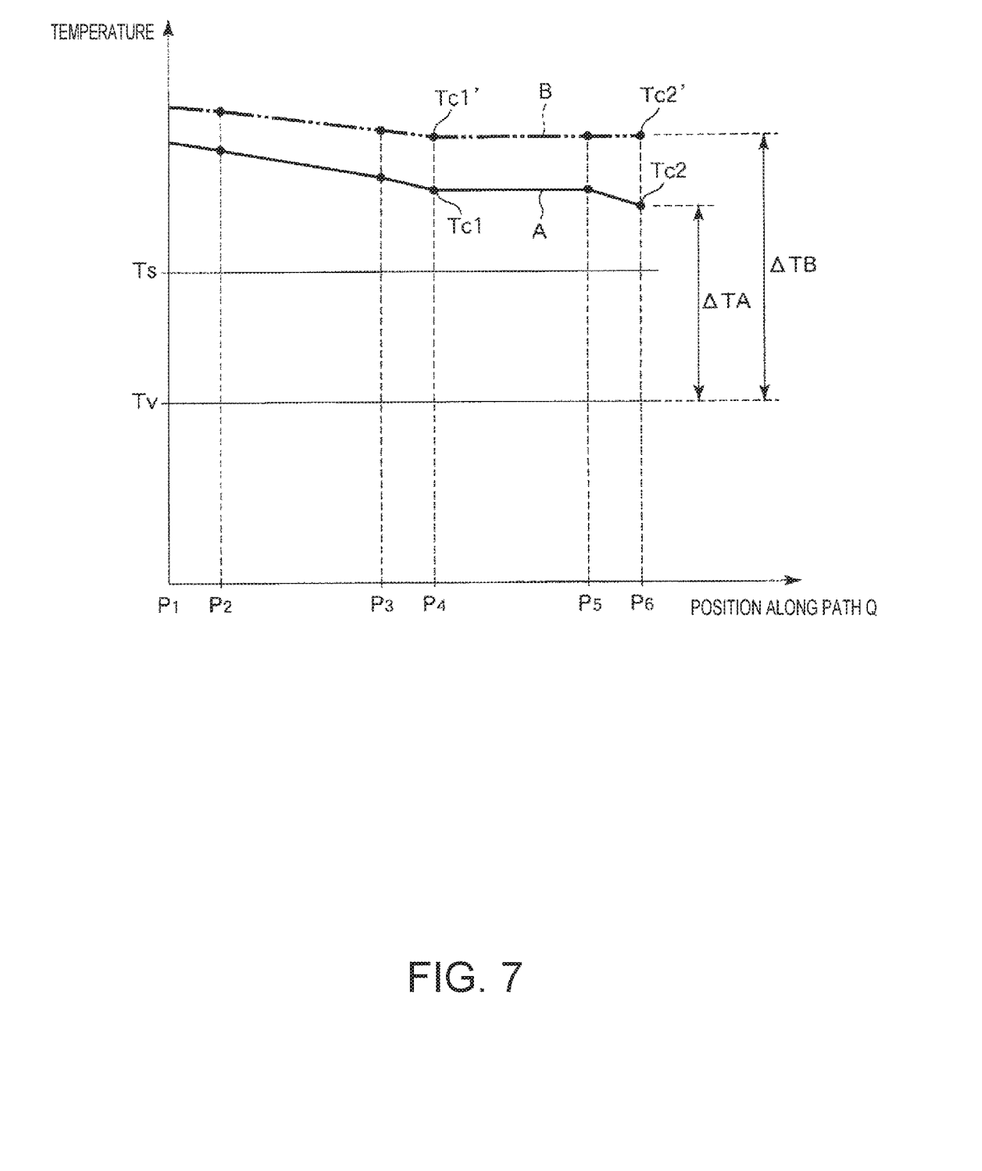
FIG. 7 is a graph illustrating a relation between a position and temperature in a heat transmission path of the light-emitting element module illustrated in FIG. 4.

FIG. 4 is a sectional view illustrating a light-emitting element module included in the atomic oscillator illustrated in FIGS. 2 and 3. FIG. 5 is a plan view illustrating the light-emitting element module illustrated in FIG. 4. FIG. 6 is a plan view illustrating a lid included in the light-emitting element module illustrated in FIG. 4. FIG. 7 is a graph illustrating a relation between a position and temperature in a heat transmission path of the light-emitting element module illustrated in FIG. 4. Hereinafter, to facilitate the description, the upper side in FIG. 4 is referred to as a "top" and the lower side is referred to as a "bottom".

As illustrated in FIG. 4, the light-emitting element module 1 includes the Peltier device 2, the light-emitting element 3, the temperature sensor 4, the package 5 that accommodates them.

The package 5 includes a base 51 that includes a depression portion 511 open toward the upper surface and a lid 52 that is joined to the base 51 and blocks an opening (upper opening) of the depression portion 511. An internal space S which is an airtight space in which the Peltier device 2, the light-emitting element 3, and the temperature sensor 4 are accommodated is formed between the base 51 and the lid 52. In the package 5, it is preferably in a depressurized (vacuum) state. Thus, it is possible to reduce an influence of an external temperature change of the package 5 on the light-emitting element 3, the temperature sensor 4, or the like inside the package 5, and thus it is possible to reduce a variation in the temperature of the light-emitting element 3, the temperature sensor 4, or the like inside the package 5. The package 5 may not be in the depressurized state either and an inert gas such as nitrogen, helium, or argon may be sealed.

A material of the base 51 is not particularly limited. A material that has an insulation property and is suitable for forming the internal space S as an airtight space, for example, various kinds of ceramics such as oxide-based ceramics such as alumina, silica, titania, and zirconia, nitride-based ceramics such as silicon nitride, aluminum nitride, and titanium nitride, and carbide-based ceramics such as silicon carbide, can be used.

The base 51 includes a stepped portion 512 that is on the upper side of the bottom surface of the depression portion 511 and is formed to surround the outer circumference of the bottom surface of the depression portion 511. As illustrated in FIG. 5, connection electrodes 62a, 62b, 62c, 62d, 62e, and 62f are installed on the upper surface of the stepped portion 512. The connection electrodes 62a, 62b, 62c, 62d, 62e, and 62f (hereinafter also referred to as "connection electrodes 62a to 62f") are electrically connected to external mounting electrodes 61a, 61b, 61c, 61d, 61e, and 61f (hereinafter also referred to as "external mounting electrodes 61a to 61f) installed on the lower surface of the base 51 via through-electrodes (not illustrated) penetrating the base 51, respectively.

Materials of the connection electrodes 62a to 62f and the external mounting electrodes 61a to 61f are not particularly limited. For example, metal materials such as gold (Au), a gold alloy, platinum (Pt), aluminum (Al), an aluminum alloy, silver (Ag), a silver alloy, chromium (Cr), a chromium alloy, nickel (Ni), copper (Cu), molybdenum (Mo), niobium (Nb), tungsten (W), iron (Fe), titanium (Ti), cobalt (Co), zinc (Zn), and zirconium (Zr) can be exemplified.

A seal ring 53 with a frame shape (circular shape) is installed as an intermediate member on the upper boundary of the base 51. The seal ring 53 is formed of, for example, a metal material such as Kovar and is joined to the base 51 by soldering or the like. The lid 52 is joined to the base 51 via the seal ring 53 by seam welding or the like. The seal ring 53 can also be formed of a metal material with relatively low thermal conductivity. In this case, it is possible to prevent heat of the side of the base 51 from being transmitted to the side of the lid 52, and thus it is easy to achieve Tc2<Tc1 to be described below.

As illustrated in FIGS. 4 and 6, the lid 52 includes a body portion 54 that has a plate shape, a protrusion portion 55 that is installed on the body portion 54 and has a cylindrical shape, and a window 56 that blocks an opening of the protrusion portion 55.

The body portion 54 includes a first portion 54a that supports the protrusion portion 55, a second portion 54b that is joined to the base 51 (more specifically, the base 51 via the seal ring 53), and a third portion 54c that connects the first portion 54a to the second portion 54b. Here, a thickness t2 of the second portion 54b and a thickness t3 of the third portion 54c are thinner than a thickness t1 of the first portion 54a. The thickness t2 of the second portion 54b is the same as the thickness t3 of the third portion 54c. In the embodiment, when outer circumference of the thickness t2 of the body portion 54 is divided into two portions using the inner circumference edge 531 of the seal ring 53 as a boundary in a plan view for ascertainment, the outer portion of the two portions can be said to be the second portion 54b and the inner portion can be said to be the third portion 54c. The thickness of the outer circumference portion of the first portion 54a is continuously thinned toward the third portion 54c. In this way, the upper surface and the lower surface of the first portion 54a are continuously connected to the upper surface and the lower surface of the third portion 54c. A hole 541 penetrated in the thickness direction is formed in the first portion 54a. At least a part of the light LL from the light-emitting element 3 passes through the hole 541. A material of the body portion 54 is not particularly limited. A metal material is suitably used. It is desirable to use a metal material with a linear expansion coefficient similar to that of the material of the base 51. Accordingly, for example, when the base 51 is formed of a ceramics substrate, it is desirable to use an alloy such as Kovar as the material of the body portion 54.

The protrusion portion 55 inwardly includes a hole 551 that communicates with the hole 541 of the above-described body portion 54 and a hole 552 that communicates with the hole 551 opposite to the hole 541 with respect to the hole 551. At least a part of the light LL from the light-emitting element 3 passes through each of the holes 551 and 552. Here, the width (diameter) of the hole 552 is greater than the width (diameter) of the hole 551. Thus, a stepped portion 553 is formed between the holes 551 and 552. The stepped portion 553 is inclined at an inclination angle θ with respect to the plate surface of the above-described body portion 54. As illustrated in FIG. 6, the outer circumferential surface of the protrusion portion 55 includes a pair of curved surfaces 555 formed along a cylindrical surface and a pair of flat portions 554 flat and formed between the one pair of curved surfaces 555. The one pair of flat portions 554 is formed along the outer shape of the first portion 54a of the body portion 54 in the plan view, thereby ensuring the third portion 54c of the above-described body portion 54. By forming the one pair of flat portions 554, it is easy to weld the base 51 and the lid 52. By forming the one pair of curved surfaces 555, it is possible to ensure necessary mechanical strength of the protrusion portion 55.

A material of the protrusion portion 55 may be different from the material of the body portion 54. However, it is desirable to use a metal material with a linear expansion coefficient similar to that of the material of the body portion 54 and it is more desirable to use the same material as the material of the body portion 54. The protrusion portion 55 may be formed to be separate from the body portion 54 to be joined by a known joining method or may be formed to be integrated (collectively) with the body portion 54 using a mold.

The window 56 formed of a plate-shaped member through which the light LL passes is installed inside the hole 552. The window 56 is joined onto the above-described stepped portion 553 by a known joining method and blocks the opening of the hole 551 of the above-described protrusion portion 55 on the side of the hole 552. Here, since the stepped portion 553 is inclined at the inclination angle θ with respect to the plate surface 540 of the body portion 54, as described above, a surface 560 of the window 56 is also inclined at the inclination angle θ with respect to the plate surface 540 of the body portion 54. The inclination angle θ is not particularly limited, but is preferably equal to or greater than 5 degrees and equal to or less than 45 degrees. Thus, it is possible to reduce an adverse influence on the property of the light-emitting element 3 since the light LL from the light-emitting element 3 is reflected from the lower surface (the surface 560) and the upper surface of the window 56 and is incident as return light on the light-emitting element 3 while exerting a necessary optical property of the window 56 with a relatively simple configuration. The window 56 has a transmission property for the light LL from the light-emitting element 3. A material of the window 56 is not particularly limited. For example, a glass material can be exemplified. The window 56 may be an optical component such as a lens or a light reduction filter. The window 56 may be installed to be parallel to the plate surface 540 of the body portion 54 without being inclined.

On the lid 52, as illustrated in FIG. 4, the body portion 54 and the protrusion portion 55 engage with the holder 304 of the above-described optical system unit 30 to be positioned. More specifically, the plate surface of the body portion 54 comes into contact with a positioning surface 306 of the holder 304, so that the lid 52 and the light-emitting element module 1 are positioned in the direction of the optical axis a of the light-emitting element 3. When the protrusion portion 55 is inserted into the through-hole 305 of the holder 304 and side surfaces (more specifically, the one pair of curved surfaces 555 described above) of the protrusion portion 55 to come into contact with the inner wall surface of the through-hole 305, the lid 52 and the light-emitting element module 1 are positioned in a direction vertical to the optical axis a of the light-emitting element 3. By bringing the body portion 54 and the protrusion portion 55 in contact with the holder 304 in this way, it is possible to reduce the temperature of the lid 52 because of heat dissipation from the holder 304 which is formed of a metal material and has a heat dissipation property.

The Peltier device 2 is disposed on the bottom surface of the depression portion 511 of the base 51 of the package 5. The Peltier device 2 is fixed to the base 51 by, for example, an adhesive. As illustrated in FIG. 4, the Peltier device 2 includes a pair of substrates 21 and 22 and a joint 23 installed between the substrates 21 and 22. The substrates 21 and 22 are formed of a material that has excellent thermal conductivity, such as a metal material or a ceramics material. Insulation films are formed on the surfaces of the substrates 21 and 22, as necessary. The lower surface of the substrate 21 is fixed to the base 51 of the package 5. On the other hand, a pair of terminals 24 and 25 are installed on the upper surface of the substrate 21, as illustrated in FIG. 5. The substrate 22 is installed so that the pair of terminals 24 and 25 are exposed. The pair of terminals 24 and 25 are electrically connected to the connection electrodes 62a and 62b installed in the package 5 via interconnections 81a and 81b which are wire interconnections (bonding wires). The joint 23 is configured to include a plurality of joints of two types of different metals or semiconductors that generate the Peltier effect by conduction from the pair of terminals 24 and 25.

In the Peltier device 2, one of the substrates 21 and 22 serves as a heat generator side and the other substrate serves as a heat absorber side by the Peltier effect generated in the joint 23. Here, in the Peltier device 2, according to a direction of a current to be supplied, a state in which the substrate 21 serves as the heat generator side and the substrate 22 serves as the heat absorber side and a state in which the substrate 21 serves as the heat absorber side and the substrate 22 serves as the heat generator side can be switched. Therefore, even when the range of an environmental temperature is broad, the temperature of the light-emitting element 3 or the like can be adjusted to a preferred temperature (target temperature). In this way, it is possible to further reduce an adverse influence (for example, a variation in the wavelength of the light LL) due to a change in temperature. Here, a target temperature (Tv) of the light-emitting element 3 can be determined according to the characteristics of the light-emitting element 3 and is not particularly limited. For example, the target temperature is equal to or greater than about 30° C. and equal or less than about 40° C. The Peltier device 2 is operated at an appropriate timing based on information from the temperature sensor 4 to heat or cool the light-emitting element 3 so that the temperature of the light-emitting element 3 is maintained to the target temperature.

The Peltier device 2 includes a metal layer 26 installed on the upper surface of the substrate 22. The metal layer 26 is formed of, for example, a metal having excellent thermal conductivity, such as aluminum, gold, or silver. The light-emitting element 3, the temperature sensor 4, and relay members 71 and 72 are disposed on the upper surface of the metal layer 26.

The light-emitting element 3 is, for example, a semiconductor laser such as a vertical cavity surface emitting laser (VCSEL). The semiconductor layer can emit two types of light with different wavelengths by superimposing a light-frequency signal on a direct-current bias current (performing modulation) for use. The light-emitting element 3 includes a pair of terminals (not illustrated). Of the pair of terminals, one terminal is a drive signal terminal and the other terminal is a grounding terminal. The drive signal terminal is electrically connected to the connection electrode 62c installed in the package 5 via the interconnection 82a, the relay member 71, and the interconnection 82b. On the other hand, the grounding terminal is electrically connected to the connection electrode 62d installed in the package 5 via the interconnection 82c, the metal layer 26, and the interconnection 82d.

The temperature sensor 4 is, for example, a temperature measurement element such as a thermistor or a thermocouple. The temperature sensor 4 includes a pair of terminals (not illustrated). Of the pair of terminals, one terminal is a measurement signal terminal and the other terminal is a grounding terminal. The measurement signal terminal is electrically connected to the connection electrode 62e installed in the package 5 via the interconnection 83a, the relay member 72, and the interconnection 83b. On the other hand, the grounding terminal is electrically connected to the connection electrode 62f installed in the package 5 via the metal layer 26 and the interconnection 83c.

The interconnections 82a, 82b, 82c, 82d, 83a, 83b, and 83c are wire-interconnections (bonding wires). Here, the interconnection 82b is configured by a plurality of wire-interconnections. In this way, it is possible to reduce electric resistance of the interconnection 82b and reduce loss of a driving signal supplied to the light-emitting element 3. From the same viewpoint, the interconnections 82c and 82d are also configured by a plurality of wire-interconnections.

The relay member 71 includes a base portion 711 that has an insulation property and an interconnection layer 712 that has conductivity and is installed on the upper surface of the base portion 711. The base portion 711 is formed of, for example, a ceramics material. A metal layer (not illustrated) is joined to the lower surface of the base portion 711. The metal layer is joined to the metal layer 26 with a joining material (not illustrated) such as a brazing filler metal. The interconnection layer 712 is formed of the same material as that of the above-described connection electrodes 62a to 62f. The interconnection layer 712 is formed in a rectangular shape and is formed in a part of the upper surface of the base portion 711. In this way, even when an electrostatic capacitance between the interconnection layer 712 and the metal layer 26 is small and a high-frequency signal is used as a driving signal supplied to the light-emitting element 3, it is possible to reduce loss of the driving signal. In addition, it is possible to ensure the size of the base portion 711 to some extent and consequently facilitate mounting of the relay member 71.

By electrically connecting the light-emitting element 3 to the connection electrodes 62c and 62d via the relay member 71 and the like, the temperature of the interconnections 82a, 82b, 82c, and 82d is adjusted by the Peltier device 2. Therefore, it is possible to reduce the variation in the wavelength of the interconnections 82a, 82b, 82c, and 82d and also accordingly reduce the variation in the temperature of the light-emitting element 3.

The relay member 72 can be configured similarly to the above-described relay member 71. However, since no high-frequency signal is used in the temperature sensor 4, the interconnection layer included in the relay member 72 may be installed across the entire region of the upper surface of the base portion.

By electrically connecting the temperature sensor 4 to the connection electrodes 62e and 62f via the relay member 72, the temperature of the interconnections 83a, 83b, and 83c is adjusted by the Peltier device 2. Therefore, it is possible to reduce the variation in the temperature of the interconnections 83a, 83b, and 83c and also accordingly reduce the variation in the temperature of the temperature sensor 4. That is, the temperature sensor 4 can be allowed to be rarely affected by heat from the second connection electrodes 62e and 62f. Therefore, it is possible to improve measurement precision of the temperature sensor 4 and consequently control the temperature of the light-emitting element 3 with high precision.

As described above, the light-emitting element module 1 that has the above-described configuration includes the Peltier device 2, the light-emitting element 3 that is disposed on the Peltier device 2, and the package 5 that accommodates the Peltier device 2 and the light-emitting element 3. Here, the package 5 includes the base 51 in which the Peltier device 2 is disposed and the lid 52 which is joined to the base 51. The internal space S accommodating the Peltier device 2 and the light-emitting element 3 formed between the base 51 and the lid 52. In the illustrated embodiment, the lid 52 is indirectly joined to the base 51 (via an intermediate member such as the seal ring 53), but the lid 52 may be directly joined to the base 51.

When Ts is external temperature of the package 5, Tv is temperature of the light-emitting element 3, Tc1 is temperature of the base 51, and Tc2 is temperature of the lid 52, a relation of Ts<Tc2<Tc1 is satisfied under the condition that a relation of Tv<Ts is satisfied. That is, the package 5 is configured such that the temperature Tc2 of the lid 52 is lower than the temperature Tc1 of the base 51 under the condition that the external temperature Ts of the package 5 is higher than the temperature Tv (set temperature) of the light-emitting element 3.

Since the relation of Tc2<Tc1 is satisfied even under the condition that the relation of Tv<Ts is satisfied in the light-emitting element module 1, it is possible to reduce a temperature difference between the light-emitting element 3 and the lid 52. Accordingly, even when the installation environment of the light-emitting element module 1 is at high temperature, it is possible to reduce radiation (emission) of heat from the lid 52 to the light-emitting element 3. Thus, it is possible to reduce a variation in the temperature of the light-emitting element 3 using the Peltier device 2 even under high temperature. The "temperature Tv of the light-emitting element 3" is set temperature of temperature control by the above-described temperature controller 504. The "temperature Tc1 of the base 51" is temperature of a portion with the lowest temperature in the base 51. Similarly, the "temperature Tc2 of the lid 52" is temperature of a portion with the lowest temperature in the lid 52.

Here, a temperature difference (Tc1–Tc2) between the temperature Tc2 of the lid 52 and the temperature Tc1 of the base 51 is preferably equal to or greater than 5° C. and equal to or less than 30° C. and is more preferably equal to or greater than 10° C. and equal to or less than 20° C. Thus, it is possible to effectively reduce the radiation (emission) of the heat from the lid 52 to the light-emitting element 3 while facilitating design of the package 5. The external temperature of the package 5 is preferably lower than the temperature of the lower surface of the Peltier device 2. Thus, it is possible to satisfy the relation of Tc2<Tc1 while simplifying the configuration of the light-emitting element module 1. Under the condition that the relation of Tv<Ts is satisfied, a temperature difference (the temperature of the lower surface–the temperature of the upper surface) between the lower surface and the upper surface of the Peltier device 2 is preferably equal to or greater than 40° C. and equal to or less than 60° C. Thus, it is possible to maintain the light-emitting element 3 at an appropriate temperature even when the external temperature of the package 5 is high temperature of about 60° C.

In the embodiment, as described above, the lid 52 includes the protrusion portion 55 protruding to the opposite side to the base 51. Thus, it is possible to increase the area of the opposite surface to the base 51 of the lid 52, and thus improve the heat dissipation property of the lid 52. That is, the protrusion portion 55 serves a heat dissipation fin. Therefore, it is possible to satisfy the relation of Tc2<Tc1 with a relatively simple configuration and it is possible to enlarge a difference between the temperature (Tc1) of the base 51 and the temperature (Tc2) of the lid 52.

More specifically, the light-emitting element 3 is cooled and Tv is lowered under the condition that the relation of Tv<Ts is satisfied. Therefore, since the upper surface side (the side of the lid 52) of the Peltier device 2 is at low temperature, the lower surface side of the Peltier device 2 (the side of the base 51) is at high temperature. Thus, the heat is transmitted from the base 51 to the lid 52 along a heat transmission path Q indicated by a two-dot chain line in FIG. 4. Here, the transmission path Q passes from the Peltier device 2 to the window 56 in the order of a position P1 located on the lower surface of the Peltier device 2, a position P2 located in a lower portion of the base 51, a position P3 located in the boundary of the base 51 and the seal ring 53, a position P4 located in the boundary of the lid 52 and the seal ring 53, a position P5 located in the body portion 54 of the lid 52, a position P6 located in the boundary of the protrusion portion 55 and the window 56, and a position P7 located in the window 56. In the light-emitting element module 1, as indicated by a line segment A in FIG. 7, temperature from the position P1 to the position P4 and temperature from the position P5 to the position P6 gradually decrease. Thus, it is possible to satisfy the relation of Tc2<Tc1 and it is possible to reduce a difference ($\Delta$TA) between the temperature Tc2 of the lid 52 and the temperature Tv of the light-emitting element. Although not illustrated in FIG. 7, the temperature of the position P7 is lower than the temperature of the position P6.

When the lid 52 is formed in a simple plate shape, the heat dissipation property of the lid 52 is bad and the temperature of the lid 52 is uniform. Here, when the heat dissipation property of the lid 52 is bad, the temperature of the base 51 and the lid 52 also increases. A portion with the lowest temperature in the base 51 is a contact portion of the base 51 with the lid 52. Therefore, as indicated by a line segment B of a two-dot chain line in FIG. 7, temperature Tc2' of the lid 52 is the same as temperature Tc1' of the base 51. Therefore, the difference ($\Delta$TB) between the temperature Tc2' of the lid 52 and the temperature Tv of the light-emitting element may increase.

The lid 52 includes the window 56 through which the light LL from the light-emitting element 3 is transmitted and the window 56 is installed in the protrusion portion 55. Thus, it is possible to increase a separate distance between the window 56 and the light-emitting element 3. Therefore, it is possible to reduce the radiation of the heat from the window 56 to the light-emitting element 3. The window 56 can be formed by effectively using the protrusion portion 55. Therefore, it is possible to further miniaturize the light-emitting element module 1 than when the distance between the entire lid 52 and the light-emitting element 3 is increased.

Further, the lid 52 includes a first portion 54a that supports the protrusion portion 55, the second portion 5 4b that is joined to the base 51, and the third portion 54c that is located between the first portion 54a and the second portion 54b and has a thickness thinner than the first portion 54a. Thus, by setting a thickness t3 of the third portion 54c to be thin, it is possible to improve thermal resistance of the third portion 54c. Therefore, it is possible to reduce transmission of heat from the second portion 54b which is a joining portion to the base 51 of the lid 52 to the first portion 54a. A thickness t1 of the first portion 54a can be set to be thick and it is possible to ensure necessary mechanical strength of the lid 52. Further, it is possible to reduce stress occurring in the first portion 54a when the lid 52 and the base 51 are joined and it is possible to reduce breakdown of the joining portions of the window 56 and the protrusion portion 55.

The width of the third portion 54c is not particularly limited, but is preferably equal to or greater than 0.3 times and equal to or less than 2 times the width of the second portion 54b and is preferably equal to or greater than 0.5 times and equal to or less than 1.5 times. Thus, it is possible to improve thermal resistance of the third portion 54c while ensuring necessary mechanical strength of the lid 52.

Here, the thickness t2 of the second portion 54b is thinner than the thickness t1 of the first portion 54a. Thus, it can be easy to join the lid 52 to the base 51 by seam welding or the like. In particular, in the embodiment, the thickness t2 of the second portion 54b is the same as the thickness t3 of the third portion 54c. Thus, it can be easy to manufacture the lid 52 and it is possible to reduce occurrence of unwilling stress even when positional displacement occurs when the lid 52 is joined to the base 51.

The thermal conductivity of the material of the lid 52 is preferably higher than the thermal conductivity of the material of the base 51. Thus, it is possible to improve the heat dissipation property of the lid 52 and improve thermal resistance of the base 51. Therefore, it is possible to satisfy the relation of Tc2<Tc1 with a relatively simple configuration and it is possible to increase the difference between the temperature (Tc1) of the base 51 and the temperature (Tc2) of the lid 52.

The internal space S of the package 5 is preferably depressurized to lower than the atmospheric pressure. Thus, it is possible to effectively reduce a variation in the temperature of the light-emitting element 3 due to a change in the external temperature of the package 5. When the internal space S is depressurized, an influence of heat radiation from the lid 52 to the light-emitting element 3 is considerable. Therefore, in this case, it is particularly useful to satisfy the relation of Ts<Tc2<Tc1 under the condition that the relation of Tv<Ts is satisfied.

The above-described atomic oscillator 10 includes the above-described light-emitting element module 1. Thus, it is possible to reduce a variation in the temperature of the light-emitting element 3 using the Peltier device 2 even under high temperature. Therefore, by reducing a variation in the wavelength of the light from the light-emitting element 3, it is possible to realize the atomic oscillator 10 with an excellent oscillation property using the light.

The atomic oscillator 10 includes the holder 304 which is a "heat dissipation member" that has a heat dissipation property and is disposed to be in contact with at least a part of the outer surface of the lid 52. Thus, it is possible to considerably dissipate heat from the lid 52. Therefore, it is possible to satisfy the relation of Tc2<Tc1 with a relatively simple configuration and it is possible to increase the difference between the temperature (Tc1) of the base 51 and the temperature (Tc2) of the lid 52.

2. Electronic Apparatus

The light-emitting element module 1 and the atomic oscillator 10 described above can be embedded in various electronic apparatus. Hereinafter, an electronic apparatus will be described.

Figure 8:
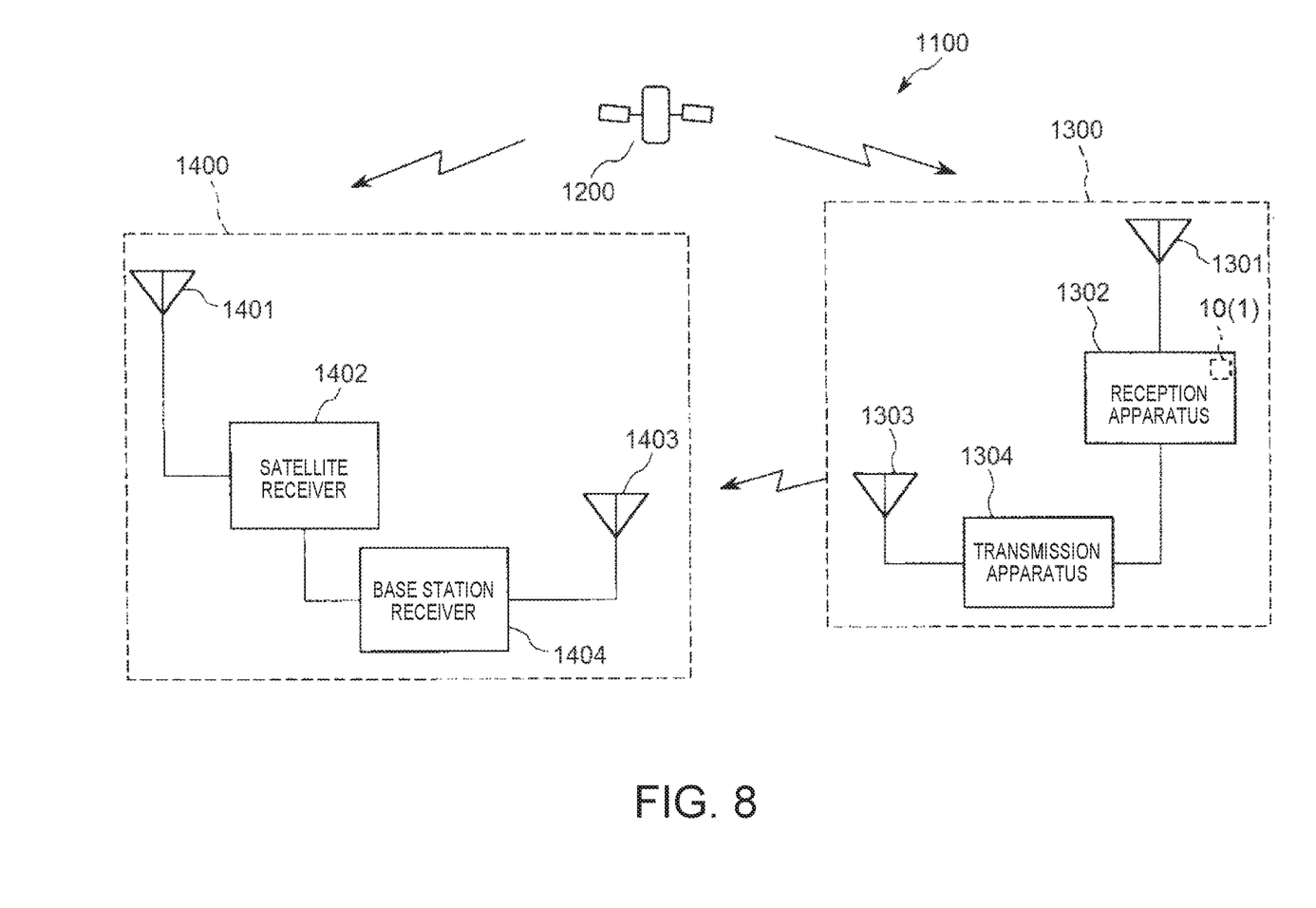
FIG. 8 is a diagram illustrating a schematic configuration when the atomic oscillator is used in a positioning system using GPS satellites.

FIG. 8 is a diagram illustrating a schematic configuration when the atomic oscillator according to the embodiment is used in a positioning system using GPS satellites.

A positioning system 1100 illustrated in FIG. 8 is configured to include a GPS satellite 1200, a base station apparatus 1300, and a GPS reception apparatus 1400.

The GPS satellite 1200 transmits positioning information (a GPS signal).

The base station apparatus 1300 includes a reception apparatus 1302 that receives the positioning information with high precision from the GPS satellite 1200 via an antenna 1301 installed at, for example, an electronic standard point (GPS continuous observation station) and a transmission apparatus 1304 that transmits the positional information received by the reception apparatus 1302 via an antenna 1303.

Here, the reception apparatus 1302 is an electronic apparatus that includes the above-described atomic oscillator (the light-emitting element module 1) according to the above-described embodiment as a standard frequency oscillation source. The positional information received by the reception apparatus 1302 is transmitted in real time by the transmission apparatus 1304.

The GPS reception apparatus 1400 includes a satellite receiver 1402 that receives the positioning information from the GPS satellite 1200 via an antenna 1401 and a base station receiver 1404 that receives the positional information from the base station apparatus 1300 via an antenna 1403.

The reception apparatus 1302 which is an "electronic apparatus" included in the foregoing positioning system 1100 includes the above-described light-emitting element module 1. In this way, it is possible to reduce a variation in the temperature of the light-emitting element 3 using the Peltier device 2 even under high temperature. Therefore, ii is possible to exert an excellent property regardless of an insulation environment of the reception apparatus 1302.

The electronic apparatus including the light-emitting element module according to the embodiment is not limited to the above-described electronic apparatus. The invention can be applied to, for example, a smartphone, a tablet terminal, a timepiece, a mobile phone, a digital still camera, an ink jet ejection apparatus (for example, an ink jet printer), a personal computer (a mobile personal computer or a laptop personal computer), a television, a video camera, a video tape recorder, a car navigation apparatus, a pager, an electronic organizer (also including a communication function unit), an electronic dictionary, a calculator, an electronic game apparatus, a word processor, a workstation, a television telephone, a security television monitor, electronic binoculars, a POS terminal, a medical apparatus (for example, an electronic thermometer, a blood-pressure meter, a blood-sugar meter, an electrocardiographic apparatus, an ultrasonic diagnostic apparatus, or an electronic endoscope), a fish finder, various measurement apparatuses, meters (for example, meters for cars, airplanes, and ships), a flight simulator, a digital terrestrial broadcast, and a mobile phone base station.

3. Vehicle

Figure 9:
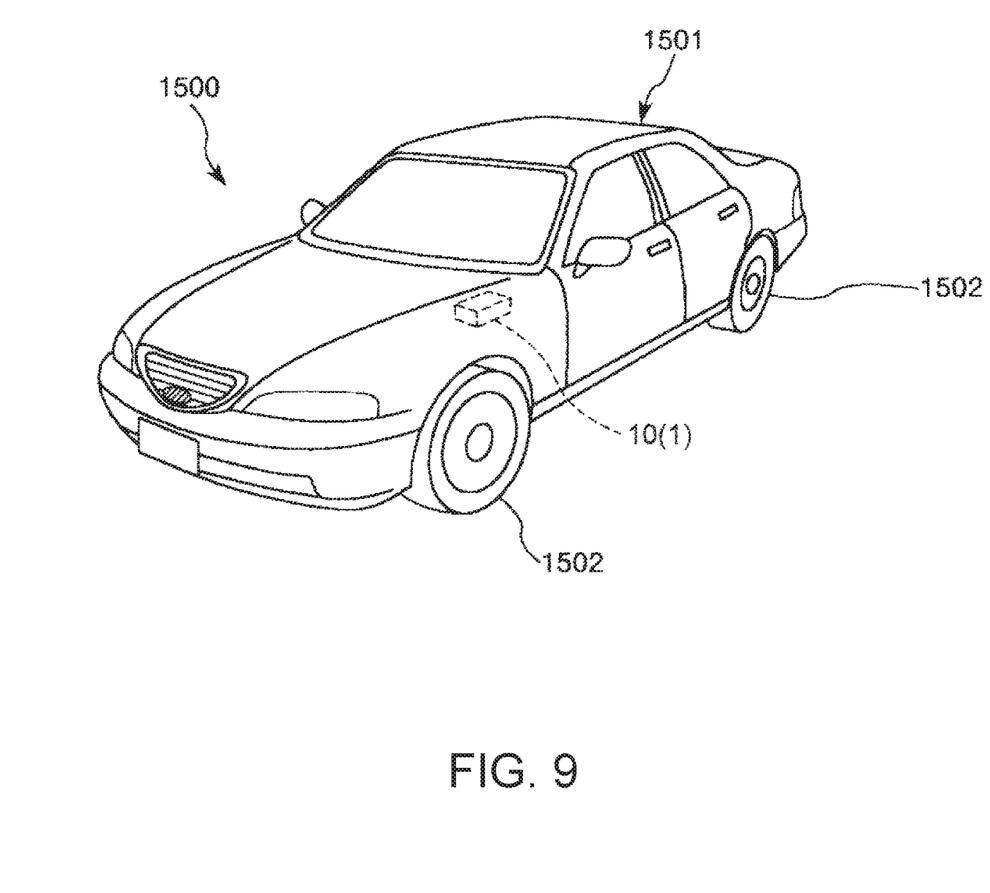
FIG. 9 is a diagram illustrating an example of a vehicle.

FIG. 9 is a diagram illustrating an example of a vehicle according to the invention.

In the drawing, a vehicle 1500 includes a body 1501 and four wheels 1502 and is configured to rotate the wheels 1502 by a power source (engine) (not illustrated) installed in the body 1501. The vehicle 1500 contains the atomic oscillator 10 (the light-emitting element module 1).

The above-described vehicle 1500 includes the above-described light-emitting element module 1. Thus, it is possible to reduce a variation in the temperature of the light-emitting element 3 using the Peltier device 2 even under high temperature. In particular, in a vehicle such as an automobile, the temperature of an installation environment of the light-emitting element module 1 easily becomes high. Therefore, it is particularly useful to use the light-emitting element module 1.

The light-emitting element module, the atomic oscillator, the electronic apparatus, and the vehicle according to the invention have been described above according to the illustrated embodiments, but the invention is not limited thereto.

The configuration of each unit according to the invention can be replaced with any configuration that has the same function as that according to the above-described embodiment and any configuration can also be added.

In the above-described embodiment, the case in which the invention is applied to the atomic oscillator that resonates and transitions cesium using coherent population trapping by two types of light with different wavelengths has been described, but the invention is not limited thereto. The invention is also applicable to an atomic oscillator that resonates and transitions rubidium or the like using a double resonance phenomenon by light and microwaves.

In the above-described embodiment, the case in which the light-emitting element module according to the invention is used in the atomic oscillator has been described, but the invention is not limited thereto. The light-emitting element module can be used for all devices that adopt a light-emitting element. For example, the light-emitting element module according to the invention is also applicable to a magnetic sensor and a quantum memory.

What is claimed is:

1. A light-emitting element module comprising:
   a Peltier device;
   a light-emitting element that is disposed on the Peltier device; and
   a package that accommodates the Peltier device and the light-emitting element, the package including a base on which the Peltier device is disposed and a lid joined to the base,
   wherein when Ts is external temperature of the package, Tv is temperature of the light-emitting element, Tc1 is temperature of the base, and Tc2 is temperature of the lid, Ts<Tc2<Tc1 is satisfied in a case of Tv<Ts,
   wherein the lid includes a protrusion portion protruding to an opposite side to the base, and
   wherein the lid includes a first portion which supports the protrusion portion, a second portion which is joined to the base and located laterally outward from the first portion in a plan view of the lid, a third portion located laterally outward from the first portion in the plan view which is located between the first potion and the second portion and has a thickness thinner than the first portion, and the second portion is located laterally outward from the third portion in the plan view.

2. The light-emitting element module according to claim 1,
   wherein the lid includes a window which is disposed in the protrusion portion and through which light from the light-emitting element is transmitted.

3. The light-emitting element module according to claim 1,
   wherein a thickness of the second portion is thinner than a thickness of the first portion.

4. The light-emitting element module according to claim 1,
   wherein the pressure of an internal space of the package is lower than an atmospheric pressure.

5. The light-emitting element module according to claim 1,
   wherein thermal conductivity of a material of the lid is higher than thermal conductivity of a material of the base.

6. An atomic oscillator comprising:
   a light-emitting element module comprising:
      a Peltier device;
      a light-emitting element that is disposed on the Peltier device; and a package that accommodates the Peltier device and the light-emitting element, the package including a base on which the Peltier device is disposed and a lid joined to the base, wherein when Ts is external temperature of the package, Tv is temperature of the light-emitting element, Tc1 is temperature of the base, and Tc2 is temperature of the lid, Ts<Tc2<Tc1 is satisfied in a case of Tv<Ts, wherein the lid includes a protrusion portion protruding to an opposite side to the base, and wherein the lid includes a first portion which supports the protrusion portion, a second portion which is joined to the base and located laterally outward from the first portion in a plan view of the lid, a third portion located laterally outward from the first portion in the plan view which is located between the first potion and the second portion and has a thickness thinner than the first portion, and the second portion is located laterally outward from the third portion in the plan view.

7. The atomic oscillator according to claim 6, further comprising:

a heat dissipation member that is in contact with at least a part of an outer surface of the lid.

8. An electronic apparatus comprising:
a light-emitting element module comprising:
   a Peltier device;
   a light-emitting element that is disposed on the Peltier device; and
   a package that accommodates the Peltier device and the light-emitting element, the package including a base on which the Peltier device is disposed and a lid joined to the base, wherein when Ts is external temperature of the package, Tv is temperature of the light-emitting element, Tc1 is temperature of the base, and Tc2 is temperature of the lid, Ts<Tc2<Tc1 is satisfied in a case of Tv<Ts, wherein the lid includes a protrusion portion protruding to an opposite side to the base, and wherein the lid includes a first portion which supports the protrusion portion, a second portion which is joined to the base and located laterally outward from the first portion in a plan view of the lid, a third portion located laterally outward from the first portion in the plan view which is located between the first potion and the second portion and has a thickness thinner than the first portion, and the second portion is located laterally outward from the third portion in the plan view.

* * * * *